(12) United States Patent
Nishimoto et al.

(10) Patent No.: US 9,355,986 B2
(45) Date of Patent: May 31, 2016

(54) SOLDER JOINT STRUCTURE, POWER MODULE, POWER MODULE SUBSTRATE WITH HEAT SINK AND METHOD OF MANUFACTURING THE SAME, AND PASTE FOR FORMING SOLDER BASE LAYER

(71) Applicant: MITSUBISHI MATERIALS CORPORATION, Tokyo (JP)

(72) Inventors: Shuji Nishimoto, Kitamoto (JP); Kimihito Nishikawa, Gotemba (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/378,226

(22) PCT Filed: Feb. 14, 2013

(86) PCT No.: PCT/JP2013/053488
§ 371 (c)(1),
(2) Date: Aug. 12, 2014

(87) PCT Pub. No.: WO2013/122126
PCT Pub. Date: Aug. 22, 2013

(65) Prior Publication Data
US 2015/0035137 A1 Feb. 5, 2015

(30) Foreign Application Priority Data
Feb. 14, 2012 (JP) .................................. 2012-029646
Feb. 14, 2012 (JP) .................................. 2012-029683

(51) Int. Cl.
*H01L 23/48* (2006.01)
*H01L 23/00* (2006.01)
(Continued)

(52) U.S. Cl.
CPC .............. *H01L 24/33* (2013.01); *B23K 1/0016* (2013.01); *B23K 1/19* (2013.01); *B23K 1/203* (2013.01);
(Continued)

(58) Field of Classification Search
CPC ........... H01L 2924/01047; H01L 2224/01047; H01L 2224/13575; H01L 2224/03505
USPC .......................... 257/772, 762, 750, E23.023
See application file for complete search history.

(56) References Cited

U.S. PATENT DOCUMENTS 5,333,668 A * 8/1994 Jorstad ............... B22D 19/0009
164/100
6,006,819 A * 12/1999 Shimizu ................. B22D 19/00
164/100
(Continued)

FOREIGN PATENT DOCUMENTS

JP 03-022306 A 1/1991
JP 04-037009 A 2/1992
(Continued)

OTHER PUBLICATIONS

International Search Report mailed Apr. 23, 2013, issued for PCT/JP2013/053488.
(Continued)

*Primary Examiner* — Nitin Parekh
(74) *Attorney, Agent, or Firm* — Locke Lord LLP

(57) ABSTRACT

There are provided a solder joint structure, a power module using the joint structure, a power module substrate with a heat sink and a method of manufacturing the same, as well as a solder base layer forming paste which is disposed and fired on a metal member to thereby react with an oxide film generated on the surface of the metal member and form the solder base layer on the metal member, capable of suppressing the occurrence of waviness and wrinkles on the surface of the metal member even at the time of loading the power cycle and heat cycle and improving the joint reliability with a joint member.

4 Claims, 6 Drawing Sheets

(51) Int. Cl.
| | |
|---|---|
| *B23K 1/00* | (2006.01) |
| *B23K 35/30* | (2006.01) |
| *B23K 35/36* | (2006.01) |
| *B23K 35/02* | (2006.01) |
| *B23K 1/19* | (2006.01) |
| *B23K 1/20* | (2006.01) |
| *H01L 23/367* | (2006.01) |
| *H01L 23/373* | (2006.01) |

(52) U.S. Cl.
CPC ......... *B23K 35/025* (2013.01); *B23K 35/0222* (2013.01); *B23K 35/0244* (2013.01); *B23K 35/0272* (2013.01); *B23K 35/30* (2013.01); *B23K 35/3006* (2013.01); *B23K 35/36* (2013.01); *B23K 35/3602* (2013.01); *B23K 35/3607* (2013.01); *H01L 23/367* (2013.01); *H01L 24/83* (2013.01); *H01L 23/3735* (2013.01); *H01L 24/29* (2013.01); *H01L 24/32* (2013.01); *H01L 2224/03505* (2013.01); *H01L 2224/04026* (2013.01); *H01L 2224/27505* (2013.01); *H01L 2224/29005* (2013.01); *H01L 2224/29083* (2013.01); *H01L 2224/29111* (2013.01); *H01L 2224/29239* (2013.01); *H01L 2224/29286* (2013.01); *H01L 2224/29299* (2013.01); *H01L 2224/29324* (2013.01); *H01L 2224/29339* (2013.01); *H01L 2224/29386* (2013.01); *H01L 2224/32225* (2013.01); *H01L 2224/32245* (2013.01); *H01L 2224/8321* (2013.01); *H01L 2224/8384* (2013.01); *H01L 2224/83192* (2013.01); *H01L 2224/83539* (2013.01); *H01L 2224/83686* (2013.01); *H01L 2224/83801* (2013.01); *H01L 2924/014* (2013.01); *H01L 2924/0105* (2013.01); *H01L 2924/01013* (2013.01); *H01L 2924/01028* (2013.01); *H01L 2924/05432* (2013.01); *H01L 2924/12042* (2013.01); *H01L 2924/1305* (2013.01); *H01L 2924/1306* (2013.01); *H01L 2924/13055* (2013.01); *H01L 2924/15787* (2013.01); *H01L 2924/351* (2013.01)

(56) References Cited

U.S. PATENT DOCUMENTS

| | | | | |
|---|---|---|---|---|
| 6,443,211 | B1* | 9/2002 | Myers | B22D 19/08 164/100 |
| 6,484,790 | B1* | 11/2002 | Myers | B22D 19/08 164/100 |
| 7,015,583 | B2* | 3/2006 | Ishii | H01L 23/488 257/232 |
| 7,298,049 | B2* | 11/2007 | Amoh | H01S 5/02272 257/772 |
| 7,687,907 | B2* | 3/2010 | Okuda | H01L 21/6835 257/737 |
| 2005/0034791 | A1* | 2/2005 | Lee | B23K 35/0244 148/400 |
| 2005/0194690 | A1* | 9/2005 | Ishii | B23K 1/0016 257/772 |
| 2007/0057022 | A1* | 3/2007 | Mogami | H01L 21/563 228/101 |
| 2008/0296782 | A1* | 12/2008 | Otremba | H01L 23/49513 257/783 |
| 2009/0004369 | A1* | 1/2009 | Inaba | C03C 3/064 428/99.2 |
| 2010/0132404 | A1* | 6/2010 | Shuja | F25B 39/02 62/524 |
| 2013/0107573 | A1* | 5/2013 | Kadomi | G02F 1/133617 362/611 |

FOREIGN PATENT DOCUMENTS

| | | |
|---|---|---|
| JP | 2007-311526 A | 11/2007 |
| JP | 2008-227336 A | 9/2008 |
| JP | 2010-287554 A | 12/2010 |
| JP | 2010-287869 A | 12/2010 |
| WO | WO-2005/078828 A1 | 8/2005 |

OTHER PUBLICATIONS

Office Action mailed Oct. 6, 2015, issued for the Japanese patent application No. 2012-029683 and English translation thereof.

* cited by examiner

SOLDER JOINT STRUCTURE, POWER MODULE, POWER MODULE SUBSTRATE WITH HEAT SINK AND METHOD OF MANUFACTURING THE SAME, AND PASTE FOR FORMING SOLDER BASE LAYER

TECHNICAL FIELD

The present invention relates to a solder joint structure obtained by soldering an aluminum member made of aluminum or an aluminum alloy and a joint member using a solder material; a power module using the solder joint structure; a power module substrate with a heat sink and a method of manufacturing the same; and a solder base layer forming paste that forms a solder base layer on a metal member by being disposed and fired on the metal member.

Priority is claimed on Japanese Patent Application No. 2012-029646, filed Feb. 14, 2012, and Japanese Patent Application No. 2012-029683, filed Feb. 14, 2012, the contents of which are incorporated herein by reference.

BACKGROUND ART

As a solder joint structure formed by soldering a metal member and a joint member using a solder material, for example, the power module as shown in Patent Documents 1 and 2 can be exemplified.

The power module is provided with a power module substrate formed by soldering a metal plate (for example, aluminum (Al)) which is to become a circuit layer on one surface of a ceramic substrate, and a power element (semiconductor device) mounted on one surface of the circuit layer.

In addition, on the other side of the power module substrate, in order to dissipate heat from the power element (semiconductor device), a radiator plate or cooler is provided at times as a heat sink.

In the power module described above, the circuit layer and the power element (semiconductor device) are joined via a solder material. That is, it is configured as a solder joint structure in which the circuit layer is formed of a metal member (aluminum member) and the power element (semiconductor device) is formed of a joint member.

In addition, the power module substrate and the heat sink are also joined through a solder material in some cases.

It should be noted that in those cases where the circuit layer or the like is formed of an aluminum member made of aluminum or aluminum alloy, since an oxide film of aluminum is formed on the surface of the circuit layer, it is impossible to carry out soldering, as it is, in a favorable manner.

Further, when the circuit layer or the like is formed of a copper member made of copper or a copper alloy, the melted solder material and copper react and the components of the solder material infiltrates into the inside of the copper member of the circuit layer or the like to alter the characteristics, which is a problem.

Accordingly, conventionally, a Ni plating film has been formed as a base layer on the surface of the circuit layer by electroless plating or the like, and the semiconductor device has been joined by disposing a solder material on the Ni plating film.

Here, in the power module described above, a power cycle and heat cycle are loaded at the time of use thereof. When the power cycle and heat cycle are loaded in the power module, there was a possibility that the stress due to the difference in coefficients of thermal expansion of the ceramic substrate and circuit layer (aluminum) acts on the joint interface between the ceramic substrate and the circuit layer, thereby reducing the joint reliability. Accordingly, conventionally, the circuit layer is formed with a metal member (aluminum) having a relatively small deformation resistance such as 4N aluminum with a purity of 99.99% or more, so that the thermal stress described above is absorbed by deformation of the circuit layer, thereby improving the joint reliability.

In addition, in Patent Document 3, a conductive composition (solder base layer forming paste) capable of forming a conductive joining layer (solder base layer) to conduct a circuit layer made of aluminum or aluminum alloy and a solder layer without providing a Ni plating film has been described, and a structure in which the above circuit layer and a joint member are joined through a glass layer, an Ag layer, and a solder layer has been disclosed.

CITATION LIST

Patent Document

[Patent Document 1] Japanese Unexamined Patent Application, First Publication No. 2007-311526

[Patent Document 2] Japanese Unexamined Patent Application, First Publication No. 2008-227336

[Patent Document 3] Japanese Unexamined Patent Application, First Publication No. 2010-287554

DISCLOSURE OF INVENTION

Technical Problem

In the meantime, when a circuit layer is formed with a metal member (aluminum or the like) having a relatively small deformation resistance with a purity of 99.99% or more, such as 4N aluminum, at the time of loading a power cycle and heat cycle, waviness and wrinkles occur on the surface of the circuit layer, which was a problem. When the waviness and wrinkles occur on the surface of the circuit layer, the reliability of the power module reduces.

In addition, in Patent Document 3, although it was possible to form a conductive joining layer by firing that conducts with the circuit layer by reacting with the aluminum oxide film generated naturally on the circuit layer surface, there was no perspective for the waviness and wrinkles on the circuit layer surface that occur after soldering of the circuit layer and the semiconductor device.

In particular, in recent years, miniaturization and thinning of the power module has advanced, while the use environment thereof has also intensified, and the amount of heat generated from electronic components such as semiconductor devices has increased. For this reason, the conditions of the power cycle and heat cycle are getting tighter, the waviness and wrinkles tend to occur on the surface of the circuit layer, and there was a problem of reduced reliability of the power module.

It should be noted that such waviness and wrinkles also become a problem in the junction between the power module substrate and the heat sink.

The present invention takes the above circumstances into consideration, with an object of providing a solder joint structure capable of suppressing the occurrence of waviness and wrinkles on the surface of an aluminum member, and improving the joint reliability with a joint member, even at the time of loading the power cycle and the heat cycle; a power module using the solder joint structure, a power module substrate with a heat sink and a manufacturing method thereof.

The present invention further has an object of providing a solder base layer forming paste which is disposed and fired on a metal member to thereby react with an oxide film generated on the surface of the metal member and form the solder base layer on the metal member, and which is capable of suppressing the occurrence of waviness and wrinkles on the surface of the metal member even at the time of loading the power cycle and heat cycle.

Solution to Problem

As a result of intensive studies, the inventors of the present invention have found that when an Ag layer is formed on one surface of a metal member (aluminum member), even at the time of loading the heat cycle, the deformation of the solder is suppressed, and the occurrence of waviness and wrinkles on the surface of the metal member (aluminum member) is suppressed. It is presumed that since Ag is a harder metal than aluminum, plastic deformation of the aluminum member is suppressed by the Ag layer.

However, at the time of heat cycle loading, the metal member was plastically deformed locally to form waviness and wrinkles in some cases.

In addition, as a result of further studies, it was found that cracks occurred inside the solder at the location where Ag is diffused into the solder to result in the Ag leaching in some cases. That is, it has become apparent that at a location where the Ag leaching has occurred, the Ag layer is not formed sufficiently, and the surface of the metal member (aluminum member) causes a local plastic deformation, thereby generating waviness and wrinkles and possibly causing the cracks inside the solder.

The present invention has been made on the basis of the findings described above, and the solder joint structure of the present invention is a solder joint structure obtained by joining an aluminum member made of aluminum or aluminum alloy with a joint member using a solder material, which is characterized by including a glass layer formed on the surface of the aluminum member, an Ag layer laminated on the glass layer, and a solder layer laminated on the Ag layer, and crystalline oxide particles are dispersed in the Ag layer.

According to the solder joint structure of this configuration, since the crystalline oxide particles are dispersed in the Ag layer, the diffusion of Ag into the solder is suppressed. In addition, since it is possible to prevent the occurrence of cracks generated in the solder by suppressing the occurrence of waviness and wrinkles generated in the aluminum member, the reliability of the solder joint structure with the joint member can be improved.

Further, because the glass layer is formed on the surface of the aluminum member, an oxide film present on the surface of the aluminum member can be removed by the reaction with the glass layer, and it is possible to reliably join the aluminum member and the joint member via the solder material. Therefore, there is no need to provide a Ni plating film or the like on the surface of the aluminum member.

Further, it is preferable that the crystalline oxide particles be composed of any one or two or more of titanium oxide, silicon oxide, and zinc oxide.

If the crystalline oxide particles selected from titanium oxide, silicon oxide, and zinc oxide are dispersed in the Ag layer that is joined with the solder, the diffusion of Ag into the solder is suppressed. As a result of the oxide particles being dispersed in Ag, area in the Ag layer where necking occurs at the time of firing is reduced. When soldering is carried out on the Ag layer that is sintered as described above, as compared with the Ag layer that has been necked completely, since the diffusion of Ag into the solder is less likely to occur, it is possible to suppress the leaching of Ag to the solder.

The power module of the present invention is a power module including a power module substrate in which a circuit layer made of an aluminum member is disposed on one surface of an insulating layer, and a semiconductor device joined to one surface of the circuit layer, which is characterized in that a junction between the circuit layer and the semiconductor device is a solder joint structure described above.

In the power module of the present invention having such a configuration, a circuit layer made of an aluminum member and a semiconductor device serving as a joint member are joined via a glass layer, an Ag layer in which the crystalline oxide particles are dispersed, and a solder layer. For this reason, the diffusion of Ag into the solder is suppressed and the formation of the Ag layer can be maintained, and it is possible to suppress the occurrence of waviness and wrinkles on the surface of the circuit layer.

Therefore, it is possible to suppress the occurrence of cracks in the solder layer and to thereby provide a power module with excellent joint reliability of the semiconductor device.

A heat-sink-attached power module substrate of the present invention is a power module substrate with a heat sink, including a power module substrate in which a circuit layer is disposed on one surface of an insulating layer, and a heat sink that is joined to the other surface of the power module substrate, which is characterized in that at least one of a joint surface of the heat sink and a joint surface of the power module substrate is composed of an aluminum member, and a junction between the heat sink and the power module substrate has a solder joint structure described above.

In the power module substrate with a heat sink of the present invention having such a configuration, since at least one of a joint surface of the power module substrate and a joint surface of the heat sink is composed of an aluminum member, one of a member having the joint surface of the power module substrate and a member having the joint surface of the heat sink corresponds to the aluminum member of the solder joint structure described above, and the other corresponds to the joining member. Then, the aluminum member and the joint member are joined via a glass layer, an Ag layer in which the crystalline oxide particles are dispersed, and a solder layer. For this reason, the Ag layer can be maintained by suppressing the diffusion of Ag into the solder, and it is possible to suppress the occurrence of waviness and wrinkles on the surface of the aluminum member.

Therefore, the joint reliability of the power module substrate and the heat sink improves, and it is possible to efficiently dissipate the heat through the heat sink.

It should be noted that as the heat sink, the metal parts for the purpose of lowering the temperature by heat dissipation such as a plate-shaped heat sink, a cooler in which a refrigerant flows through, a liquid-cooled or air-cooled radiator in which a fin is formed, and a heat pipe are included.

A method of manufacturing a solder joint structure according to the present invention is a method of manufacturing a solder joint structure for joining an aluminum member made of aluminum or aluminum alloy and a joint member using a solder material, which includes: a coating step of applying a solder base layer forming paste which contains glass and the crystalline oxide particles on the surface of the aluminum member; a firing step of firing the solder base layer forming paste being coated by a heat treatment; and a soldering step of soldering the joint member onto the surface of an Ag fired layer composed of a fired body of the solder base layer forming paste through a solder material, and characterized in that the crystalline oxide particles are dispersed in the Ag fired layer.

According to such a manufacturing method, since the crystalline oxide particles can be dispersed in the Ag sintered layer, it is possible to produce a solder joint structure capable of suppressing the diffusion of Ag into the solder in the soldering step. In addition, since it is possible to prevent the occurrence of cracks generated in the solder by suppressing the occurrence of waviness and wrinkles generated in the aluminum member, the reliability of the solder joint structure with the joint member can be improved.

A method of manufacturing a power module according to the present invention is a method of manufacturing a power module including a power module substrate in which a circuit layer made of an aluminum member is disposed on one surface of an insulating layer and a semiconductor device joined to one surface of the circuit layer, and the circuit layer and the semiconductor device form a solder junction, which is characterized in that the solder junction is formed by the method of manufacturing a solder joint structure described above.

In addition, a method of manufacturing a power module substrate with a heat sink according to the present invention is a method of manufacturing a power module substrate with a heat sink, including a power module substrate in which a circuit layer is disposed on one surface of an insulating layer, and a heat sink that is joined to the other surface of the power module substrate, and at least one of a joint surface of the heat sink and a joint surface of the power module substrate is composed of an aluminum member, and the heat sink and the power module substrate form a solder junction, which is characterized in that the solder junction is formed by the method of manufacturing a solder joint structure described above.

According to the methods of manufacturing the solder joint structure, the power module, and the power module substrate with a heat sink as described above, since an Ag fired layer in which the crystalline oxide particles are dispersed can be formed in the solder junction, it is possible to maintain the formation of the Ag layer by suppressing the diffusion of Ag into the solder during soldering, and to suppress the occurrence of waviness and wrinkles on the surface of the aluminum member.

In addition, the solder base layer forming paste according to the present invention which has been accomplished based on the findings described above is a solder base layer forming paste which forms a solder base layer on a metal member by being disposed and fired on the metal member, and is characterized by containing a silver powder, a glass powder, a crystalline oxide powder, a resin and a solvent.

According to the solder base layer forming paste having such a configuration includes a crystalline oxide powder and a silver powder, and by firing, it becomes possible for the silver powder to form an Ag layer, and for the crystalline oxide particles to further form the solder base layer which is dispersed in the Ag layer. In addition, in the case of soldering a joint member on the metal member via a solder material, the crystalline oxide particles dispersed inside the Ag layer can prevent the diffusion of Ag into the solder during the soldering, thereby maintaining the Ag layer. For this reason, even at the time of applying a heat cycle load, it is possible to suppress the occurrence of waviness and wrinkles in the metal member.

In addition, since the glass powder and the silver powder are included, and the solder base layer generated by the firing includes a glass layer formed as a result of softening of the glass powder and an Ag layer in which the silver powder is sintered on the glass layer, the glass layer reacts with the oxide film on the metal member to thereby remove the oxide film, which enables the formation of a solder base layer bonded directly onto the surface of the metal member. Further, in the solder base layer, since the conductive particles are dispersed inside the glass layer, the conductivity is ensured by the conductive particles. Therefore, for example, in the case of joining the semiconductor device onto the circuit layer via the solder material, the circuit layer can be made to conduct with the semiconductor device through the solder base layer obtained by firing the solder base layer forming paste, and it is possible to configure the semiconductor devices such as the power modules. That is, by using the solder base layer forming paste, it is possible to form a solder base layer with favorable electrical and thermal conductivity.

Here, it is preferable that: the content of the silver powder be equal to or more than 60% by mass and equal to or less than 90% by mass; the amount of the glass powder be set so that the ratio A/G of the weight A of the silver powder and the weight G of the glass powder is in the range of 80/20 to 99/1; and the amount of the crystalline oxide powder be set so that the ratio A/O of the weight A of the silver powder and the weight O of the crystalline oxide powder is in the range of 90/10 to 99/1.

In this case, since the content of the silver powder is equal to or more than 60% by mass, it is possible to impart conductivity to the solder base layer described above. In addition, since the content of the silver powder is equal to or less than 90% by mass, fluidity is ensured, which enables application to the metal member.

Further, since the ratio A/G of the weight A of the silver powder and the weight G of the glass powder is set in the range of 80/20 to 99/1, the glass layer and the Ag layer can be reliably formed.

Furthermore, with respect to the ratio A/O of the weight A of the silver powder and the weight O of the crystalline oxide powder, since the weight O of the crystalline oxide powder is equal to or less than 90/10, it is possible to form a solder base layer with favorable conductivity without increasing the resistance of the solder base layer described above. Since the conductivity is favorable, it is possible to configure a solder base layer which is also excellent in terms of heat transfer. In addition, with respect to the ratio A/O of the weight A of the silver powder and the weight O of the crystalline oxide powder, since the weight O of the crystalline oxide powder is equal to or more than 99/1, it is possible to prevent Ag from diffusing into the solder by the crystalline oxide particles that are dispersed in the Ag layer.

Further, it is preferable that the crystalline oxide powder be composed of any one or two or more of titanium oxide, silicon oxide, and zinc oxide.

If the crystalline oxide powder selected from titanium oxide, silicon oxide, and zinc oxide is dispersed in the Ag layer that is joined with the solder, the diffusion of Ag into the solder is suppressed. As a result of the oxide particles being dispersed in Ag, area in the Ag layer where necking occurs at the time of firing is reduced. When soldering is carried out on the Ag layer that is sintered as described above, as compared with the Ag layer that has been necked completely, since the diffusion of Ag into the solder is less likely to occur, it is possible to suppress the leaching of Ag to the solder.

Further, it is desirable that the softening temperature of the glass powder be 600° C. or less.

In this case, since the softening temperature of the glass powder is 600° C. or less, the glass can flow even if the solder base layer forming paste is fired at a relatively low temperature, which makes it possible to form a solder base layer. For this reason, it is possible to prevent deterioration of the metal member at the time of firing the solder base layer forming paste.

In addition, it is preferable that the glass powder contain any one or two or more of lead oxide, zinc oxide, silicon oxide, boron oxide, phosphorus oxide and bismuth oxide.

The glass powder containing these oxides will have a relatively low softening temperature, and thus the firing temperature can be set low. In addition, the crystallization temperature will be relatively high and the fluidity inside the solder base layer forming paste is secured, thereby improving adhesion with the metal member.

Further, it is desirable that the average particle size of the silver powder be equal to or more than 0.05 μm and equal to or less than 1.0 μm.

In this case, since the average particle size of the silver powder is equal to or more than 0.05 μm and equal to or less than 1.0 μm, when the solder base layer forming paste is applied onto the circuit layer, the conductive particles are uniformly dispersed, and it becomes possible to form a solder base layer having uniform conductivity by firing the solder base layer forming paste, and to reliably make the semiconductor device conduct with the circuit layer via the solder base layer.

Advantageous Effects of Invention

According to the present invention, it is possible to provide a solder joint structure capable of suppressing the occurrence of waviness and wrinkles on the surface of an aluminum member, and improving the joint reliability with a joint member, even at the time of loading the power cycle and the heat cycle; a power module using the solder joint structure, a power module substrate with a heat sink and a manufacturing method thereof.

In addition, according to the present invention, it is possible to provide a solder base layer forming paste which is disposed and fired on a metal member to thereby react with an oxide film generated on the surface of the metal member and form the solder base layer on the metal member, and which is capable of suppressing the occurrence of waviness and wrinkles on the surface of the metal member even at the time of loading the power cycle and heat cycle by preventing the Ag leaching during soldering.

BEST MODE FOR CARRYING OUT THE INVENTION

Hereinafter, a solder joint structure according to an embodiment of the present invention will be described with reference to the accompanying drawings.

Figure 1:
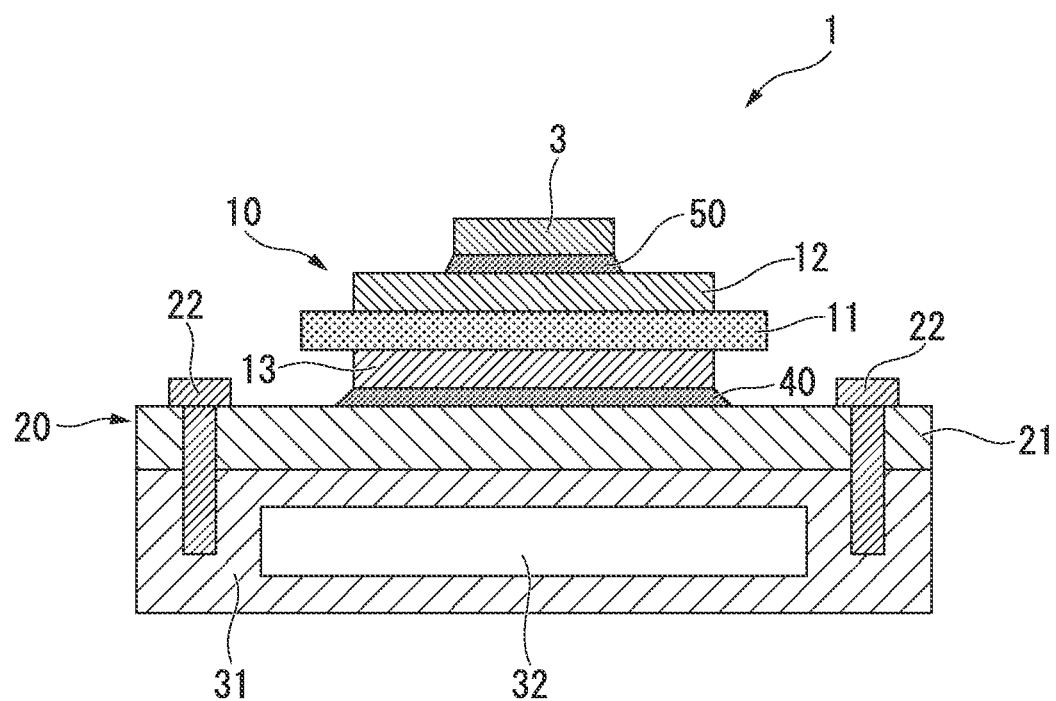
FIG. 1 is a schematic explanatory diagram of a power module substrate with a radiator plate and a power module according to a first embodiment of the present invention.

FIG. 1 shows a power module 1 and a power module substrate 20 with a radiator plate as a first embodiment of the present invention. In the first embodiment, as a heat sink, a radiator plate 21 is used.

The power module 1 includes a power module substrate 10 in which a circuit layer 12 and a metal layer 13 are disposed, a semiconductor device 3 mounted on one surface (upper surface in FIG. 1) of the circuit layer 12, the radiator plate 21 which is joined to the other surface (lower surface in FIG. 1) of the metal layer 13, and a cooler 31 which is laminated on the other surface side of the radiator plate 21.

The power module substrate 10 includes a ceramic substrate 11 constituting an insulating layer, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is provided in order to prevent the electrical connection between the circuit layer 12 and the metal layer 13, and is made of AlN (aluminum nitride) having a high insulating property. Further, the thickness of the ceramic substrate 11 is set in the range of 0.2 to 1.5 mm, and is set to 0.635 mm in the first embodiment.

The circuit layer 12 is formed by joining a conductive metal plate to one surface of the ceramic substrate 11. In the first embodiment, the circuit layer 12 is formed by joining an aluminum plate made of a rolled plate of aluminum having a purity of 99.99% or more (so-called 4N aluminum) to the ceramic substrate 11.

The metal layer 13 is formed by joining a metal plate to the other surface of the ceramic substrate 11. In the first embodiment, similarly to the circuit layer 12, the metal layer 13 is formed by joining an aluminum plate made of a rolled plate of aluminum having a purity of 99.99% or more (so-called 4N aluminum) to the ceramic substrate 11.

The radiator plate 21 is provided for diffusing heat from the aforementioned power module substrate 10 in the surface direction, and prepared as a copper plate with excellent thermal conductivity in the first embodiment.

As shown in FIG. 1, the cooler 31 is provided with a flow path 32 for flowing a cooling medium (for example, cooling water). The cooler 31 is desirably made of a material with favorable thermal conductivity, and is composed of A6063 (aluminum alloy) in the first embodiment.

It should be noted that the radiator plate 21 and the cooler 31 are fastened by a fixing screw 22, as shown in FIG. 1.

Figure 2:
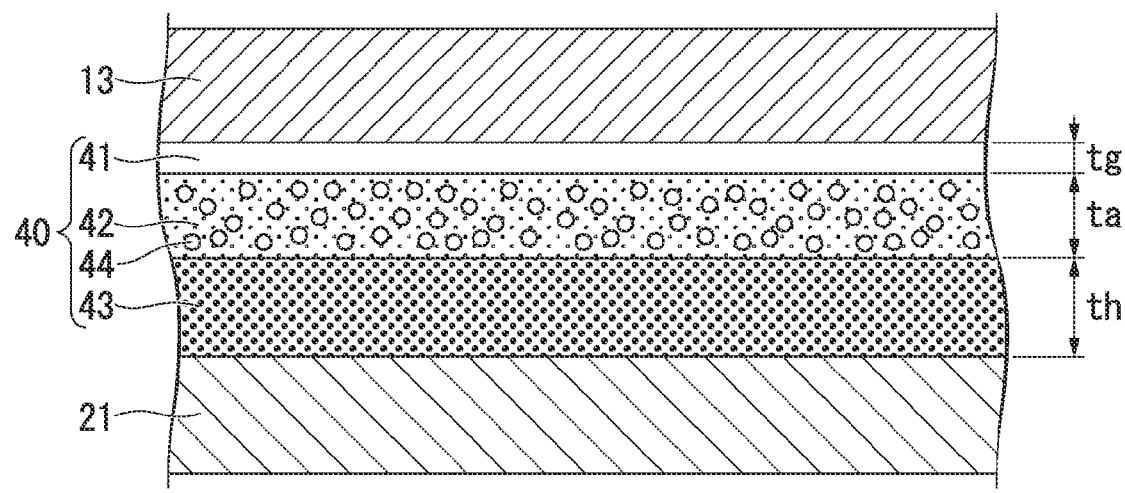
FIG. 2 is an enlarged explanatory diagram of a junction between a metal layer and a radiator plate in FIG. 1.

In addition, as shown in FIG. 2, in a first junction 40 between the metal layer 13 made of 4N aluminum and the radiator plate 21 made of copper, a first glass layer 41 formed on the other surface (lower surface in FIG. 2) of the metal layer 13, a first Ag layer 42 laminated on the other surface of the first glass layer 41, and a first solder layer 43 laminated on the other surface of the first Ag layer 42 are included.

Figure 3:
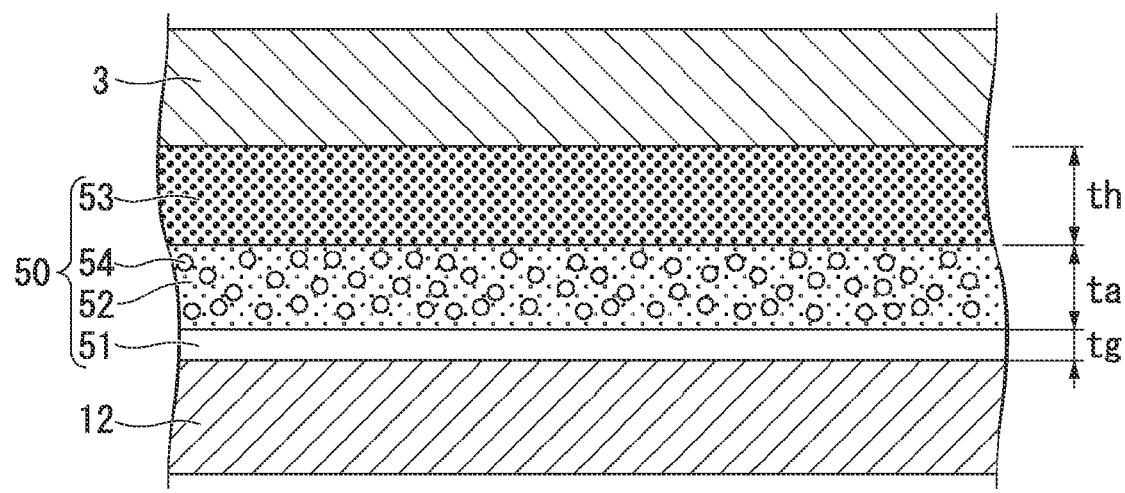
FIG. 3 is an enlarged explanatory diagram of a junction between a circuit layer and a semiconductor device in FIG. 1.

Further, as shown in FIG. 3, in a second junction 50 between the circuit layer 12 made of 4N aluminum and the semiconductor device 3, a second glass layer 51 formed on one surface (upper surface in FIG. 3) of the circuit layer 12, a second Ag layer 52 laminated on one surface of the second glass layer 51, and a second solder layer 53 laminated on one surface of the second Ag layer 52 are included.

Here, the first solder layer 43 and the second solder layer 53 are composed of, for example, an Sn—Ag-based, Sn—Cu-based, Sn—Sb-based, Sn—In-based or Sn—Ag—Cu-based solder material (so-called lead-free solder material). In addition, the thickness th of the first solder layer 43 and the second solder layer 53 is set in the range of 20 µm≤th≤600 µm.

The thickness tg of the first glass layer 41 and the second glass layer 51 is set in the range of 0.05 µm≤tg≤10 µm.

Here, in the first glass layer 41 and the second glass layer 51, fine conductive particles having an average particle size of several nanometers are dispersed therein. The conductive particles are crystalline particles containing at least one of Ag or Al. Note that the conductive particles in the first glass layer 41 and the second glass layer 51 are observed by using, for example, a transmission electron microscope (TEM).

In addition, crystalline oxide particles 44 and crystalline oxide particles 54 are dispersed in the first Ag layer 42 and the second Ag layer 52, respectively. The crystalline oxide particles 44 and 54 are composed of any one or two or more of titanium oxide, silicon oxide, and zinc oxide.

Further, an average crystal grain size of the crystalline oxide particles is equal to or greater than 0.1 µm and equal to or less than 5 and the average grain size is 0.5 µm in the first embodiment.

The crystalline oxide particles can be identified by the elemental analysis of the sections of the first Ag layer 42 and the second Ag layer 52. As an elemental analysis technique, for example, analytical methods using an electron beam, such as EPMA and EDS, may be used.

Here, the term "average particle size" refers to a particle size ($D_{50}$) at which the cumulative frequency in the particle size distribution determined by a laser diffraction scattering method reaches 50%.

In addition, the thickness ta of the first Ag layer 42 and the second Ag layer 52 is set in the range of 1 µm≤ta≤100 µm, and preferably in the range of 1.5 µm≤ta≤50 µm.

Here, the first junction 40 and the second junction 50 is formed by applying and baking a solder base layer forming paste to be described below on the surface of the metal layer 13 and the circuit layer 12 to form an Ag fired layer, and then joining the radiator plate 21 and the semiconductor device 3 onto the surface of the Ag fired layer through the solder material.

Next, a solder base layer forming paste used in the first embodiment will be described.

The solder base layer forming paste contains a silver powder, a glass powder, a crystalline oxide powder, a resin and a dispersant, and the content of the silver powder is equal to or more than 60% by mass and equal to or less than 90% by mass of the solder base layer forming paste as a whole, and the remainder being the glass powder, crystalline oxide powder, resin, solvent and dispersant. The content of the silver powder is more preferably equal to or more than 61% by mass and equal to or less than 80% by mass.

Further, the content of the glass powder is preferably equal to or more than 0.7% by mass and equal to or less than 15% by mass, and more preferably equal to or more than 1.0% by mass and equal to or less than 10% by mass. If the content of the glass powder is 20% by mass or more, the solder wettability is adversely affected, and if it is 0.1% by mass or less, adhesion of the solder base layer and the circuit layer may be reduced.

The content of the crystalline oxide powder is preferably equal to or more than 0.6% by mass and equal to or less than 10% by mass, and more preferably equal to or more than 1.0% by mass and equal to or less than 8.0% by mass. If the content of the crystalline oxide powder is 0.6% by mass or more, the solder leaching can be suppressed, and if it is 8.0% by mass or less, it is possible to obtain a solder base layer without any problem in the solder wettability.

The content of the resin is preferably equal to or more than 0.5% by mass and equal to or less than 5.0% by mass, and more preferably equal to or more than 0.8% by mass and equal to or less than 4.0% by mass. If the content of the resin is 0.5% by mass or more, printability sufficient for a paste can be imparted, and if it is 5.0% by mass or less, the sintering of silver will not be inhibited.

The content of the solvent is preferably equal to or more than 5% by mass and equal to or less than 30% by mass, and more preferably equal to or more than 8% by mass and equal to or less than 28% by mass. If the content of the solvent is 5% by mass or more, printability sufficient for a paste can be imparted, and if it is 28% by mass or less, the sintering of silver will not be inhibited.

The content of the dispersant is preferably equal to or more than 0.5% by mass and equal to or less than 7% by mass, and more preferably equal to or more than 1% by mass and equal to or less than 5% by mass. If the content of the dispersant is 0.5% by mass or more, it is possible to suppress the deterioration of the solder base layer forming paste, and if it is 7% by mass or less, the sintering of silver will not be inhibited.

Note that in the first embodiment, the viscosity of the solder base layer forming paste (conductive composition) is adjusted to 10 Pa·s or more and 500 Pa·s or less, and more preferably 50 Pa·s or more and 300 Pa·s or less.

Here, the viscosity of the solder base layer forming paste is measured with the use of a stress-controlled rheometer (AR1000 manufactured by TA Instruments Inc.) by using a probe of a parallel plate of 20 mm. The temperature of the measurement stage is set to 25° C., and the gap between the measurement stage and the probe is set to 200 µm. 10 g of the paste to be measured is placed on the measurement stage, and the probe is adjusted to a predetermined gap. At this time, paste protruding from the probe is removed using a spatula to start the measurement.

An average particle size of the silver powder is equal to or greater than 0.05 µm and equal to or less than 1.0 µm, and those having an average particle size of 0.8 µm are used in the first embodiment.

The glass powder contain, for example, any one or two or more of lead oxide, zinc oxide, silicon oxide, boron oxide, phosphorus oxide and bismuth oxide, and the softening temperature thereof is 600° C. or less. The softening temperature of the glass powder is more preferably equal to or more than 370° C. and equal to or less than 560° C.

In addition, if necessary, the glass powder may contain aluminum oxide, iron oxide, copper oxide, selenium oxide, zirconium oxide, alkali metal oxides, alkaline earth metal oxides or the like. The glass powder can be obtained by pulverizing a lump of glass with a ball mill, a jet mill or the like, and then classifying the coarse particles. The average particle size of the glass powder is not particularly limited, but it is possible to use a glass powder having an average particle size of 0.5 µm or more and 10.0 µm or less.

Further, the weight ratio A/G of the weight A of the silver powder and the weight G of the glass powder is adjusted in the range of 80/20 to 99/1, and is more preferably adjusted in the range of 85/15 to 97/3. In the first embodiment, the ratio A/G is 85/15.

Further, the weight ratio A/O of the weight A of the silver powder and the weight O of the crystalline oxide powder is in the range of 90/10 to 99/1, and is more preferably adjusted in the range of 95/5 to 98/2.

The crystalline oxide powder is, for example, a powder of titanium oxide, zinc oxide, or silicon oxide, and may be selected from any one or two or more of crystalline metal oxide powders.

The crystalline metal oxide powder preferably has an average particle size of 0.05 μm or more and 1.0 μm or less, and the average particle size may be 0.1 μm or more and 5 μm or less. In the first embodiment, those having an average particle size of 0.5 μm are used.

Note that the average particle size of the silver powder and the crystalline oxide powder refers to a particle size ($D_{50}$) at which the cumulative frequency in the particle size distribution determined by a laser diffraction scattering method reaches 50%.

As a solvent, those having a boiling point of 200° C. or higher are suitable, and, for example, α-terpineol, butyl carbitol acetate, diethylene glycol dibutyl ether or the like can be used. It should be noted that in the first embodiment, α-terpineol is used.

The resin is for adjusting the viscosity of the solder base layer forming paste (conductive composition), and those that are decomposed at 500° C. or higher are suitable, and, for example, ethyl cellulose, acrylic resins, alkyd resins or the like can be used. It should be noted that in the first embodiment, ethyl cellulose is used.

Further, in the first embodiment, a dicarboxylic-acid-based dispersant is added. Note that it is also possible to configure the solder base layer forming paste (conductive composition) without the addition of dispersants. As a dicarboxylic-acid-based dispersant, for example, KD-15S manufactured by CRODA Inc. can be used.

Figure 4:
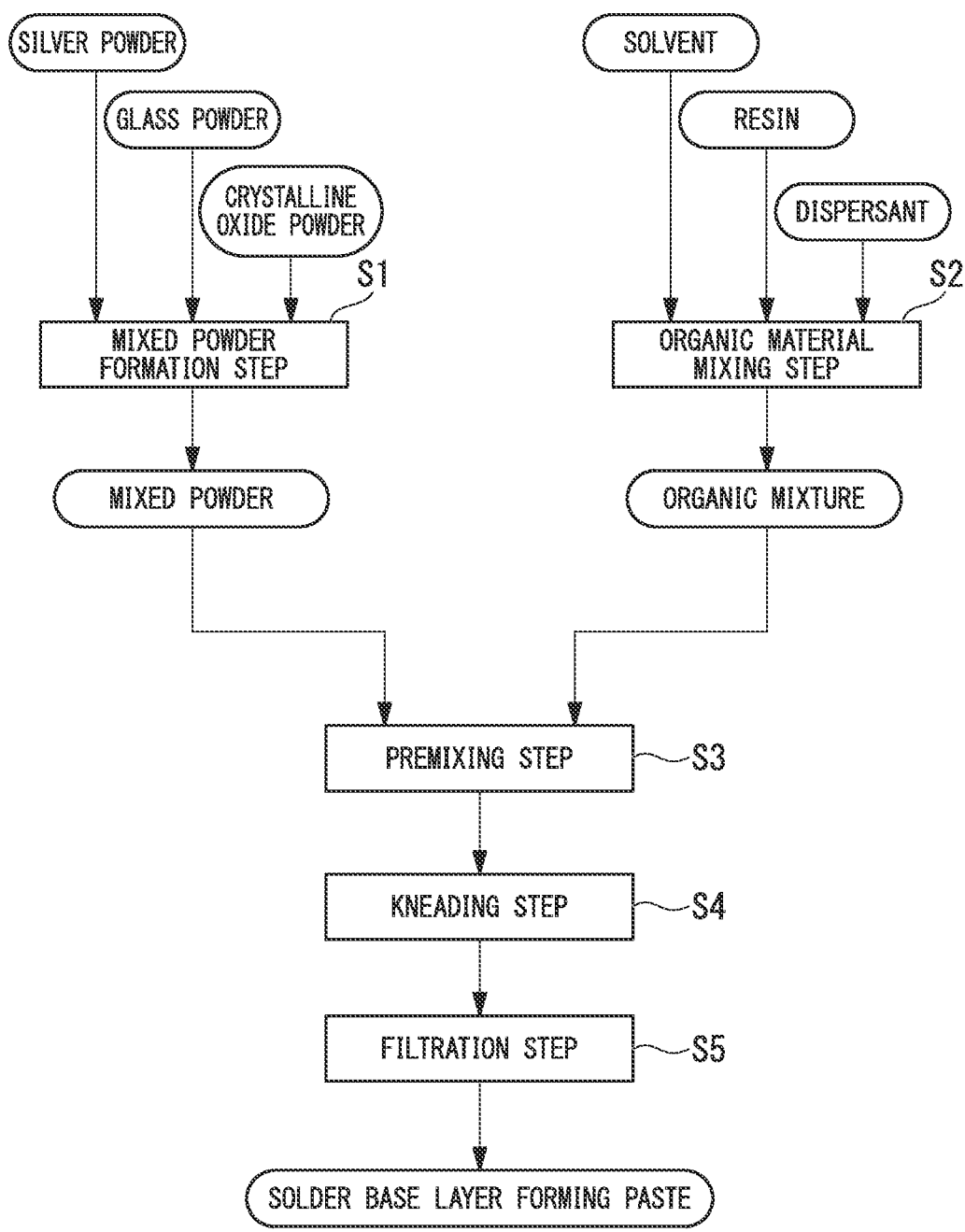
FIG. 4 is a flow diagram showing one of the methods of manufacturing a solder base layer forming paste which is used in each of the embodiments of the present invention.

Next, a method of manufacturing the solder base layer forming paste used in the first embodiment will be described with reference to the flow diagram shown in FIG. 4.

First, a mixed powder is produced by mixing the silver powder, the glass powder and the crystalline oxide powder as described above (mixed powder formation step S1). Further, an organic mixture is produced by mixing the solvent, the resin, and the dispersant (organic material mixing step S2).

Then, the mixed powder obtained in the mixed powder formation step S1 and the organic mixture obtained in the organic material mixing step S2 are premixed by a mixer (premixing step S3).

Subsequently, the pre-mixture is mixed while kneading using a roll mill machine having a plurality of rolls (kneading step S4).

The kneaded product obtained by the kneading step S4 is filtered using a paste filtration machine (filtration step S5).

In this manner, the solder base layer forming paste used in the first embodiment is manufactured.

As another type of solder base layer forming paste used in the first embodiment, those using diethylene glycol dibutyl ether as a solvent can be mentioned.

At this time, the resin is most preferably an acrylic resin which is decomposed in a nitrogen atmosphere.

Figure 8:
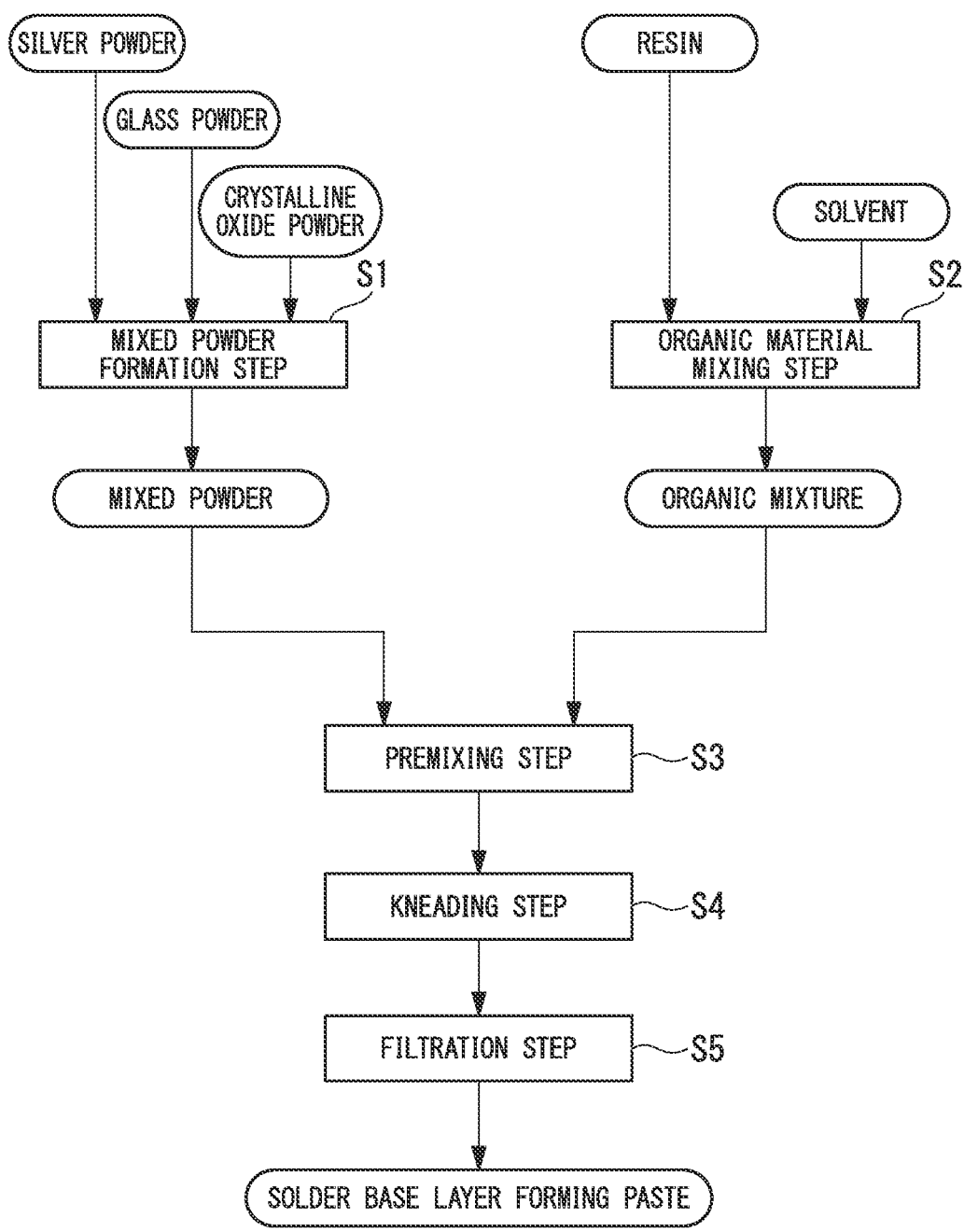
FIG. 8 is a flow diagram showing one of the methods of manufacturing a solder base layer forming paste which is used in each of the embodiments of the present invention.

Next, a method of manufacturing another type of solder base layer forming paste used in the first embodiment will be described with reference to the flow diagram shown in FIG. 8.

First, a mixed powder is produced by mixing the silver powder, the glass powder and the crystalline oxide powder as described above (mixed powder formation step S1). Further, an organic mixture is produced by mixing the solvent and the resin (organic material mixing step S2).

Then, the mixed powder obtained in the mixed powder formation step S1 and the organic mixture obtained in the organic material mixing step S2 are premixed by a mixer (premixing step S3).

Subsequently, the pre-mixture is mixed while kneading using a roll mill machine having a plurality of rolls (kneading step S4).

The kneaded product obtained by the kneading step S4 is filtered using a paste filtration machine (filtration step S5).

In this manner, another type of the solder base layer forming paste used in the first embodiment is manufactured.

Figure 5:
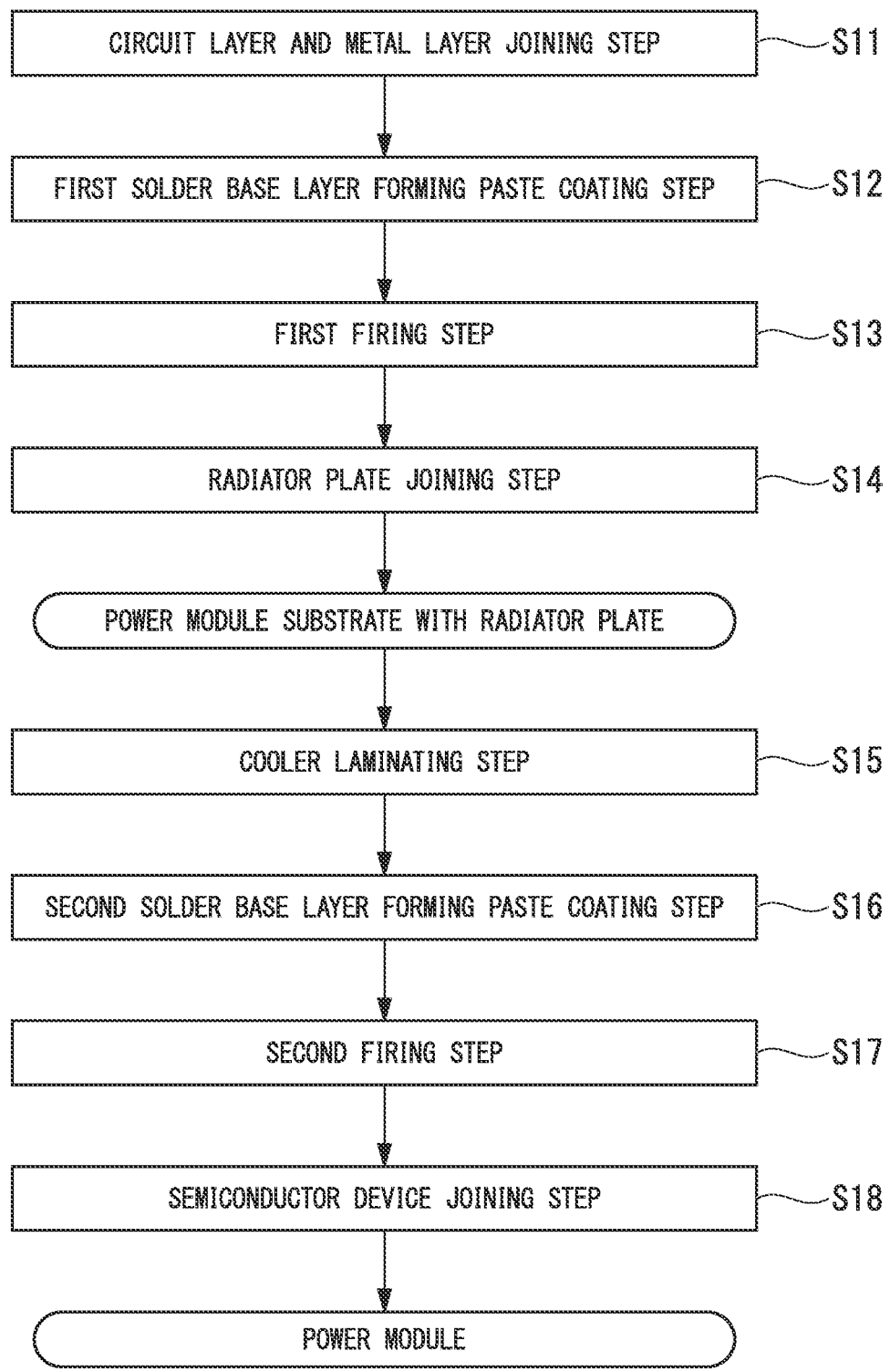
FIG. 5 is a flow diagram showing a method of manufacturing the power module of FIG. 1.

Next, a method of manufacturing a power module which is the first embodiment will be described with reference to the flow diagram of FIG. 5.

First, an aluminum plate which is to become the circuit layer 12 and an aluminum plate which is to become the metal layer 13 are prepared, and then these aluminum plates are laminated on each of one surface and the other surface of the ceramic substrate 11 through a brazing material, and the aluminum plates and the ceramic substrate 11 are joined by cooling after heating and pressurizing (circuit layer and metal layer joining step S11). It should be noted that the brazing temperature is set from 640° C. to 650° C.

Then, the solder base layer forming paste described above is applied on the other surface of the metal layer 13 (first solder base layer forming paste coating step S12). It should be noted that when applying the solder base layer forming paste, it is possible to employ various techniques such as a screen printing method, an offset printing method, and a photosensitive process.

In a state where the solder base layer forming paste is applied onto the other surface of the metal layer 13, firing of the solder base layer forming paste is carried out by being charged into a heating furnace (first firing step S13). As a result, a first Ag fired layer (not shown) is formed. Note that the firing temperature at this time is set from 350° C. to 645° C., and more preferably from 450° C. to 620° C.

Then, the radiator plate 21 is laminated on the surface of the first Ag fired layer through the solder material, and the soldering is carried out in a reducing furnace (radiator plate joining step S14).

As a result, between the metal layer 13 and the radiator plate 21, a first junction 40 having the first glass layer 41, the first Ag layer 42 in which the crystalline oxide particles 44 are dispersed, and the first solder layer 43 is formed, thereby manufacturing the power module substrate 20 with a radiator plate which is the first embodiment.

Next, the cooler 31 is laminated on the other surface side of the radiator plate 21, and is fixed by a fixing screw 22 (cooler laminating step S15).

Then, the solder base layer forming paste described above is applied on one surface of the circuit layer 12 (second solder base layer forming paste coating step S16). It should be noted that when applying the solder base layer forming paste, it is possible to employ various techniques such as a screen printing method, an offset printing method, and a photosensitive process. In the first embodiment, the solder base layer forming paste is formed in a pattern by the screen printing method.

In a state where the solder base layer forming paste is applied onto one surface of the circuit layer 12, firing of the solder base layer forming paste is carried out by being charged into a heating furnace (second firing step S17). As a result, a second Ag fired layer (not shown) is formed. Note that the firing temperature at this time is set from 350° C. to 645° C.

Then, the semiconductor device 3 is placed on the surface of the second Ag fired layer through the solder material, and the soldering is carried out in a reducing furnace (semiconductor device joining step S18).

As a result, between the circuit layer 12 and the semiconductor device 3, a second junction 50 having the second glass layer 51, the second Ag layer 52 in which the crystalline oxide particles 54 are dispersed, and the second solder layer 53 is formed, thereby manufacturing the power module 1 which is the first embodiment.

In the power module 1 which is the first embodiment constructed as described above, between the metal layer 13 and the radiator plate 21, the first junction 40 having the first glass layer 41, the first Ag layer 42, and the first solder layer 43 is formed, and between the circuit layer 12 and the semiconductor device 3, the second junction 50 having the second glass layer 51, the second Ag layer 52, and the second solder layer 53 is formed. The crystalline oxide particles 44 and 54 are contained in the first Ag layer 42 and the second Ag layer 52. For this reason, in the soldering step, the diffusion of Ag into the solder in a liquid phase is suppressed and the formation of the Ag layer can be maintained. Then, even when the power cycle and the heat cycle are loaded, the occurrence of waviness and wrinkles on the surface of the metal layer 13 and circuit layer 12 made of 4N aluminum is suppressed. Therefore, the joint reliability between the radiator plate 21 and the metal layer 13, and the joint reliability between the semiconductor device 3 and the circuit layer 12 are improved, which makes it possible to dissipate heat efficiently with the radiator plate 21.

In addition, in the first embodiment, since the crystalline oxide particles 44 and 54 are constituted of particles composed of any one or two or more of titanium oxide, silicon oxide, and zinc oxide, the effect of suppressing the diffusion of Ag into the solder is great.

Further, since the first glass layer 41 is formed on the other surface of the metal layer 13 and the second glass layer 51 is formed on one surface of the circuit layer 12, the oxide film present on the surface of the metal layer 13 and the circuit layer 12 can be removed by the first glass layer 41 and the second glass layer 51, and it becomes possible to reliably join the metal layer 13 with the radiator plate 21 and the circuit layer 12 with the semiconductor device 3 via the solder material. Therefore, there is no need to provide a Ni plating film or the like on the surface of the metal layer 13 and the circuit layer 12.

Further, in the first embodiment, since fine conductive particles having an average particle size of about few nanometers are dispersed inside the second glass layer 51 formed on one surface of the circuit layer 12 to which the semiconductor device 3 is mounted, the conductivity is ensured in the second glass layer 51, and the circuit layer 12 and the semiconductor device 3 can be electrically connected.

Furthermore, according to the solder base layer forming paste which is the first embodiment configured as described above, the crystalline oxide powder and the silver powder are included, and by firing, it becomes possible for the silver powder to form an Ag layer, and for the crystalline oxide particles 44 and 54 to further form a solder base layer which is dispersed inside the Ag layer. In addition, in the case of joining a joint member with the circuit layer 12 and the metal layer 13 through a solder material, the crystalline oxide particles 44 and 54 dispersed inside the Ag layer prevent Ag from diffusing into the solder during soldering, and it is possible to maintain the formation of the first Ag layer 42 and the second Ag layer 52 and to thereby prevent the cracks from occurring in the first solder layer 43 and the second solder layer 53. For this reason, even at the time of applying a heat cycle load, it is possible to suppress plastic deformation of the aluminum surface due to the remaining Ag film, as a result of which the occurrence of waviness and wrinkles in the circuit layer 12 and the metal layer 13 can be prevented.

In addition, since the glass powder and the silver powder are included, and the solder base layer produced by the firing is provided with the glass layers 41 and 51 formed as a result of softening of the glass powder and the Ag layers 42 and 52 in which the silver powder is sintered to the glass layers 41 and 51, the glass layers 41 and 51 react with the aluminum oxide film on the circuit layer 12 and the metal layer 13 to remove the aluminum oxide film, thereby making it possible to form a solder base layer which is joined directly to the surface of the circuit layer 12 and the metal layer 13. Further, since the conductive particles are dispersed inside the glass layer 51, the conductivity is ensured by the conductive particles.

Therefore, for example, in the case of joining the semiconductor device 3 onto the circuit layer 12 via the solder material, the circuit layer 12 can be made to conduct with the semiconductor device 3 through the solder base layer obtained by firing the solder base layer forming paste, and it is possible to configure the semiconductor devices such as the power module 1. That is, by using the solder base layer forming paste, it is possible to form a solder base layer with favorable conductivity.

In addition, since the conductivity is favorable, it is possible to configure a solder base layer which is excellent in terms of heat transfer, and to transfer heat efficiently from the power module substrate to the radiator plate.

Further, since the content of the silver powder is equal to or more than 60% by mass, it is possible to reliably form the solder base layer having conductivity as described above. In addition, since the content of the silver powder is equal to or less than 90% by mass, fluidity is ensured, which enables application to the circuit layer 12 and the metal layer 13.

Further, since the ratio A/G of the weight A of the silver powder and the weight G of the glass powder is set in the range of 80/20 to 99/1, the glass layers 41 and 51 and the Ag layers 42 and 52 can be reliably formed.

Furthermore, with respect to the weight ratio A/O of the weight A of the silver powder and the weight O of the crystalline oxide powder, since the weight O of the crystalline oxide powder is equal to or less than 90/10, it is possible to form a solder base layer with favorable conductivity without increasing the resistance of the solder base layer described above. Since the conductivity is favorable, it is possible to configure a solder base layer which is also excellent in terms of heat transfer. In addition, with respect to the ratio A/O of the weight A of the silver powder and the weight O of the crystalline oxide powder, since the weight O of the crystalline oxide powder is equal to or more than 99/1, it is possible to prevent Ag from diffusing into the solder by the crystalline oxide particles 44 and 54 that are dispersed in the Ag layers 42 and 52.

Further, since the crystalline oxide powder is selected from titanium oxide, silicon oxide, and zinc oxide, if dispersed in the Ag layer that is joined with the solder, the diffusion of Ag into the solder can be suppressed.

In addition, since the softening temperature of the glass powder is 600° C. or less, the glass can flow even if the solder base layer forming paste is fired at a relatively low temperature, which makes it possible to form a solder base layer, and it is possible to prevent the circuit layer 12 and metal layer 13 made of aluminum or aluminum alloy from deteriorating at the time of firing the solder base layer forming paste.

In addition, since the glass powder contains any one or two or more of lead oxide, zinc oxide, silicon oxide, boron oxide, phosphorus oxide and bismuth oxide, the softening temperature thereof will be relatively low, and the firing temperature can be set to a low level. Further, the crystallization temperature will be relatively high and the fluidity inside the solder base layer forming paste is secured, thereby making it possible to improve adhesion with the circuit layer 12 and the metal layer 13.

Furthermore, since the particle size of the silver powder is equal to or more than 0.05 μm and equal to or less than 1.0 μm, when the solder base layer forming paste is applied onto the circuit layer 12 and the metal layer 13, the conductive particles are uniformly dispersed, and it becomes possible to uniformly form a conductive solder base layer by firing the solder base layer forming paste.

Next, a power module 101 and a power module substrate 130 with a cooler that are a second embodiment of the present invention will be described with reference to FIG. 6 and FIG. 7. Note that in the second embodiment, a cooler 131 is used as a heat sink.

The power module 101 includes a power module substrate 110 in which a circuit layer 112 and a metal layer 113 are disposed, a semiconductor device 103 mounted on one surface (upper surface in FIG. 6) of the circuit layer 112, and the cooler 131 laminated on the other surface side of the power module substrate 110.

The power module substrate 110 includes a ceramic substrate 111 forming an insulating layer, a circuit layer 112 disposed on one surface (upper surface in FIG. 6) of the ceramic substrate 111, a metal layer 113 disposed on the other surface (lower surface in FIG. 6) of the ceramic substrate 111, and a buffer layer 115 disposed on the other surface side of the metal layer 113.

The ceramic substrate 111 is provided in order to prevent the electrical connection between the circuit layer 112 and the metal layer 113, and is formed of AlN (aluminum nitride) having a high insulating property.

The circuit layer 112 and the metal layer 113 are formed by joining a conductive metal plate to the ceramic substrate 111.

In the second embodiment, the circuit layer 112 and the metal layer 113 are formed by joining an aluminum plate made of a rolled plate of aluminum having a purity of 99.99% or more (so-called 4N aluminum) to the ceramic substrate 111.

The buffer layer 115 is composed of aluminum or aluminum alloy, copper or copper alloy, or a composite material containing aluminum (for example, AlSiC or the like).

Figure 6:
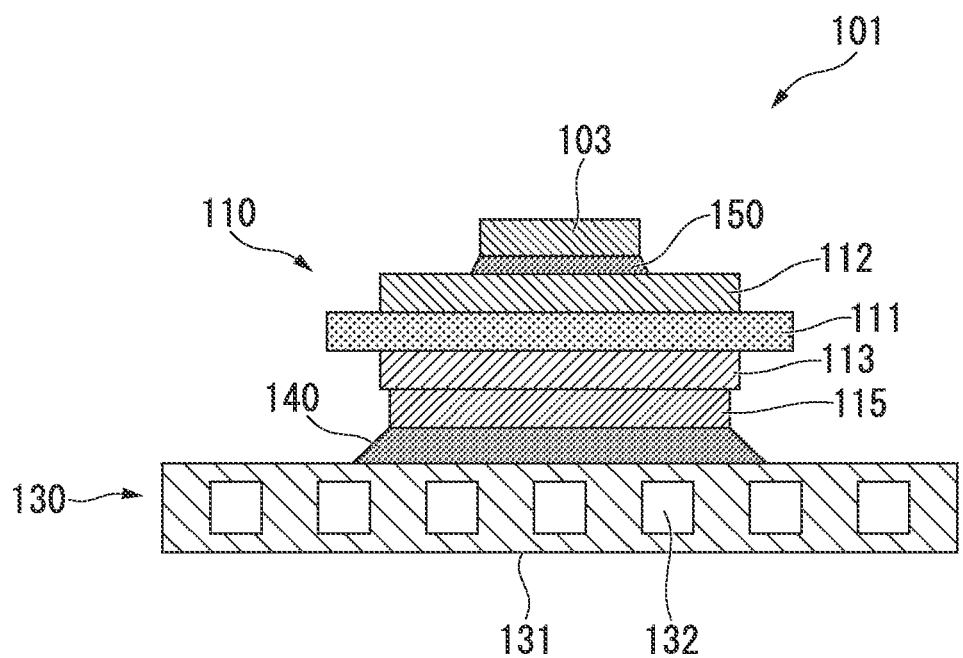
FIG. 6 is a schematic explanatory diagram of a power module substrate with a cooler and a power module according to a second embodiment of the present invention.

As shown in FIG. 6, the cooler 131 is provided with a flow path 132 for flowing a cooling medium (for example, cooling water). The cooler 131 is desirably made of a material with favorable thermal conductivity, and is composed of A6063 (aluminum alloy) in the second embodiment.

Figure 7:
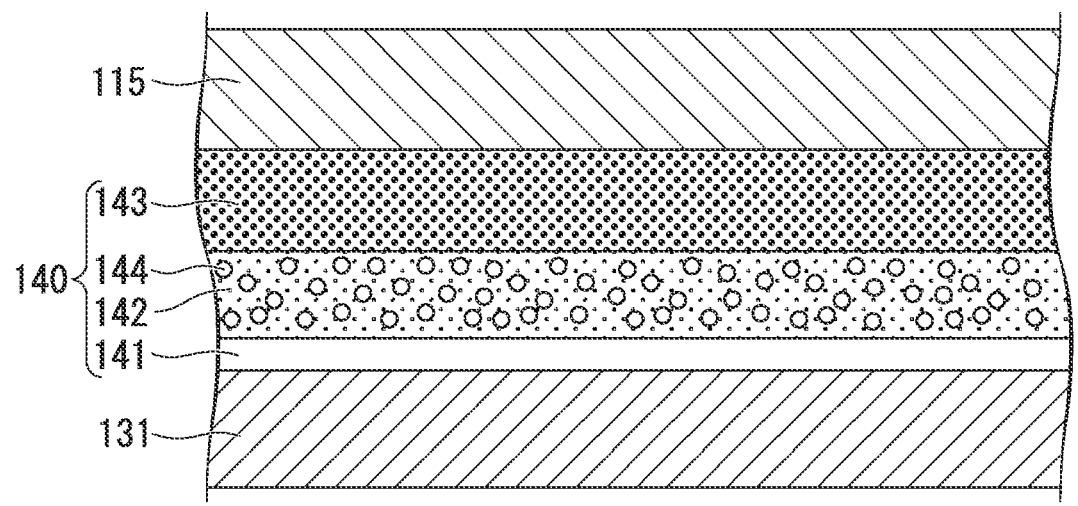
FIG. 7 is an enlarged explanatory diagram of a junction between a buffer layer and a cooler in FIG. 6.

In addition, as shown in FIG. 7, in a first junction 140 between the cooler 131 composed of A6063 (aluminum alloy) and the buffer layer 115, a first glass layer 141 formed on one surface of the cooler 131, a first Ag layer 142 laminated on the first glass layer 141, and a first solder layer 143 laminated on the first Ag layer 142 are included. Here, the crystalline oxide particles 144 are dispersed in the first Ag layer 142. The first Ag layer 142 can be formed using the same solder base layer forming paste as in the first embodiment.

In the power module 101 and the power module substrate 130 with a cooler which are the second embodiment configured as described above, between the cooler 131 made of an aluminum alloy and the buffer layer 115 of the power module substrate 110, the first junction 140 having the first glass layer 141, the first Ag layer 142, and the first solder layer 143 is formed. Further, since the crystalline oxide particles 144 are dispersed in the first Ag layer 142, the diffusion of Ag into the solder is suppressed during soldering. As a result, the occurrence of waviness and wrinkles on the surface of the cooler 131 made of an aluminum alloy is suppressed. Therefore, the joint reliability between the cooler 131 and the power module substrate 110 is improved, and the power module substrate 110 can be cooled efficiently by the cooler 131.

The embodiments of the present invention have been described above. However, the present invention is not limited thereto, and can be appropriately modified without departing from the technical spirit of the present invention.

For example, although a solder joint structure to be used in a power module has been described as an example, it is not limited thereto, and there is no limitation in the use thereof as long as it is for soldering an aluminum member (electrode member) with a joint member. In particular, it is suitable for a joint member with an element in which a power cycle or heat cycle occurs, such as the LED elements and Peltier elements.

In addition, the description has been given for the example of using the radiator plate and the cooler as a heat sink, but it is not limited thereto and may be an air-cooled or liquid-cooled radiator in which a fin is formed, a heat pipe, or the like.

Further, in the embodiments of the present invention, a metal plate constituting the circuit layer and the metal layer has been described as a rolled plate of pure aluminum having a purity of 99.99%, but is not limited thereto, and may be an aluminum having a purity of 99% (2N aluminum).

Furthermore, those using a ceramic substrate made of AlN as an insulating layer have been described, but are not limited thereto, and a ceramic substrate composed of $Si_3N_4$, $Al_2O_3$, or the like may be used, or the insulating layer may be configured with an insulating resin.

In addition, the metal plate constituting the circuit layer and the metal layer may be an aluminum member made of another type of aluminum or aluminum alloy, may be a copper member made of copper or copper alloy, or may be a metal member made of other metals.

Further, in the first embodiment, the description has been given for the case of joining the metal layer to the radiator plate, but it is not limited thereto and may be configured so as to be joined to a heat sink, such as a cooler, an air-cooled or liquid-cooled radiator in which a fin is formed, a heat pipe, or the like.

Furthermore, those using a ceramic substrate made of AlN as an insulating layer have been described, but are not limited thereto, and a ceramic substrate composed of $Si_3N_4$, $Al_2O_3$, or the like may be used, or the insulating layer may be configured with an insulating resin.

Further, the raw materials and the added amounts for the solder base layer forming paste are not limited to those described in each of the embodiments, and other types of glass powders, resins, solvents and dispersants may be used. The softening temperature only needs to be equal to or higher than the melting point of the metal member (aluminum or the like), and more preferably equal to or less than 600° C.

In addition, as a resin, acrylic resins, alkyd resins or the like may be used. Furthermore, as a solvent, α-terpineol, butyl carbitol acetate, diethylene glycol dibutyl ether or the like may be used.

EXAMPLES

The following describes the results of the confirmation experiment conducted in order to confirm the effect of the present invention.

A fired layer obtained by firing a solder base layer forming paste with the composition shown in Tables 1 and 2 was formed on a circuit layer made of an aluminum plate having a purity of 99.99% or more, and a semiconductor device was joined onto the fired layer in a reducing furnace using Sn—Ag—Cu-based lead-free solder. In Tables 1 and 2, the ratios A/G indicates (weight of silver powder)/(weight of glass powder) and A/O indicates (weight of silver powder)/(weight of crystalline oxide powder), respectively. Note that the coating thickness of the solder base layer forming paste was set to 10 μm. In addition, the firing temperature was set to 575° C., and the firing time was set to 10 minutes. As a result, an Ag fired layer (solder base layer) in which a thickness of the fired layer was about 8 μm and a thickness of the glass layer was about 1 μm was obtained.

It should be noted that as a glass powder, a lead-free, $Bi_2O_3$—ZnO—$B_2O_3$-based glass frit (glass transition temperature: 352° C., softening temperature: 402° C.) was used in Examples 1 to 6.

In Example 7 to Example 15 and Comparative Example 1 to Comparative Example 2, as a glass powder, a lead-free, $Bi_2O_3$—ZnO—$B_2O_3$-based glass frit having a softening temperature shown in Table 2 was used.

Note that a ceramic substrate composed of AlN and having a size of 30 mm×20 mm and a thickness of 0.6 mm was used.

Further, a circuit layer and a metal layer composed of 4N aluminum and having a size of 13 mm×10 mm and a thickness of 0.6 mm were used.

As the semiconductor device, an IGBT device (heater chip) having a size of 12.5 mm×9.5 mm and a thickness of 0.25 mm was used.

(Power Cycle Test)

The energization was carried out on a test piece of the IGBT device (heater chip) obtained in the manner described above by repeatedly turning ON for 2 seconds and turning OFF (cooling time) for 8 seconds under the energization conditions of 15V and 150 A to alter the temperature of the IGBT device (heater chip) in the range from 30° C. to 130° C. This power cycle was carried out 100,000 times.

(Evaluation of the Percentage of the Remaining Portion of the Ag Layer)

After the power cycle test, the test piece was cut with a diamond saw, and the cross-section was filled with a resin, followed by polishing, and an elemental analysis by EPMA (mapping) was carried out. By analyzing the cross section of the solder junction by EPMA, it was classified into a solder layer, an Ag leaching layer, and an Ag layer remaining portion, and the percentage of the cross-sectional area of the (Ag layer remaining portion)/(entire Ag layer) was evaluated. Note that the entire Ag layer refers to the total cross-sectional area of the Ag layer before the soldering when the solder base layer forming paste was fired.

(Thermal Resistance Measurement)

The initial thermal resistance at the time of the power cycle test and the thermal resistance after the test were measured. The thermal resistance measurements were carried out as follows. The IGBT device (heater chip) was heated at a power of 100 W, and the temperature of the IGBT device (heater chip) was measured by using a thermocouple. In addition, the temperature of a cooling medium (ethylene glycol: water=9:1) flowing through a cooler (heat sink) was measured. Then, values obtained by dividing the difference between the temperature of the cooling medium and the temperature of the heater chip by the power was defined as the thermal resistance, and the rate of increase in the thermal resistance after the power cycle test with respect to the initial thermal resistance was calculated.

(Confirmation of the Crystalline Oxide Particles in the Ag Layer)

Because the crystalline oxide particles do not flow during the heat treatment like the glass frit, and also do not react much with other substances, they are present in the Ag film as they were added. For this reason, the oxide particles can be confirmed by a cross-sectional observation technique such as SEM. In addition, it is also possible to identify the type of oxides by using analytical methods such as EDS and EPMA.

TABLE 1

| | Silver powder | | | | Other organic components Resin: ethyl cellulose Solvent: α-terpineol | Type of crystalline oxide powder | Softening temperature of glass powder ° C. | (Ag layer remaining portion)/ (entire Ag layer) × 100 after power cycle test % | Initial thermal resistance ° C./W | Increase rate of thermal resistance after power cycle % |
|---|---|---|---|---|---|---|---|---|---|---|
| | Mass % | Average particle size (μm) | A/G | A/O | | | | | | |
| Ex. 1 | 76 | 0.2 | 95/5 | 92/8 | Balance | $ZnO:TiO_2 = 1:1$ | 402 | 100 | 0.15 | 8 |
| Ex. 2 | 78 | 0.2 | 95/5 | 96/4 | Balance | Only ZnO | 402 | 99.7 | 0.16 | 9 |
| Ex. 3 | 72 | 0.2 | 88/12 | 92/8 | Balance | $TiO_2:SiO_2 = 1:1$ | 402 | 99.8 | 0.16 | 4 |
| Ex. 4 | 78 | 0.8 | 92/8 | 96/4 | Balance | Only $TiO_2$ | 402 | 99.7 | 0.15 | 5 |
| Ex. 5 | 75 | 0.2 | 85/15 | 92/8 | Balance | Only $SiO_2$ | 402 | 99.7 | 0.17 | 4 |
| Ex. 6 | 79 | 0.8 | 88/5 | 96/4 | Balance | Only $SiO_2$ | 402 | 98.5 | 0.16 | 7 |

As shown in Table 1, in Examples 1 to 6, the crystalline oxide particles are dispersed within the Ag layer. Therefore, the Ag remaining portion is sufficiently present after the soldering step, the rate of increase in the thermal resistance after the power cycle is small, and the joint reliability of the circuit layer and the metal layer with the ceramic substrate is high.

On the other hand, in Comparative Example 1 and Comparative Example 2, since the Ag layer did not contain the crystalline oxide particles, the Ag remaining portion was reduced, and the increase rate of the thermal resistance after the power cycle was increased, and thus the joint reliability was poor when compared with those in Examples.

TABLE 2

| | Silver powder | | | | Other organic components Resin: ethyl cellulose Solvent: α-terpineol | Type of crystalline oxide powder | Softening temperature of glass powder °C. | (Ag layer remaining portion)/(entire Ag layer) × 100 after power cycle test % | Initial heat resistance °C./W | Increase rate of heat resistance after power cycle % |
| --- | --- | --- | --- | --- | --- | --- | --- | --- | --- | --- |
| | Mass % | Average particle size (μm) | A/G | A/O | | | | | | |
| Ex. 7 | 76 | 0.40 | 95/5 | 92/8 | Balance | ZnO | 400 | 100 | 0.13 | 7 |
| Ex. 8 | 78 | 0.40 | 95/5 | 96/4 | Balance | ZnO | 400 | 99.7 | 0.14 | 8 |
| Ex. 9 | 72 | 0.40 | 88/12 | 92/8 | Balance | TiO$_2$ | 400 | 99.8 | 0.18 | 6 |
| Ex. 10 | 78 | 0.60 | 92/8 | 96/4 | Balance | TiO$_2$ | 500 | 99.7 | 0.17 | 7 |
| Ex. 11 | 75 | 0.60 | 85/15 | 92/8 | Balance | SiO$_2$ | 500 | 99.7 | 0.17 | 5 |
| Ex. 12 | 79 | 0.60 | 88/5 | 96/4 | Balance | SiO$_2$ | 500 | 98.5 | 0.15 | 4 |
| Ex. 13 | 70 | 0.80 | 95/5 | 82/18 | Balance | ZnO | 400 | 98.5 | 0.25 | 17 |
| Ex. 14 | 70 | 0.80 | 95/5 | 85/15 | Balance | TiO$_2$ | 400 | 99.2 | 0.21 | 12 |
| Ex. 15 | 70 | 0.80 | 95/5 | 82/18 | Balance | SiO$_2$ | 400 | 95.7 | 0.28 | 13 |
| Comp. Ex. 1 | 76 | 1.50 | 95/5 | 100/0 | Balance | — | 500 | 47 | 0.15 | 43 |
| Comp. Ex. 2 | 76 | 0.60 | 90/10 | 100/0 | Balance | — | 400 | 52 | 0.16 | 48 |

As shown in Table 2, in Examples 7 to 15, since the crystalline oxide powder is contained, the Ag remaining portion is large after the power cycle test, the rate of increase in the thermal resistance is small, and the joint reliability of the circuit layer and the metal layer with the ceramic substrate is high. In Examples 7 to 12, it is apparent that the ratio A/O ((weight of silver powder)/(weight of crystalline oxide powder)) is in the range of 90/10 and 99/1, and as compared with Examples 13 to 15, the rate of increase in the thermal resistance is small, and the joint reliability is high.

On the other hand, in Comparative Example 1 and Comparative Example 2, since the crystalline oxide particles were not contained, the rate of increase in the thermal resistance after the power cycle was increased, and thus the joint reliability was poor when compared with those in Examples 7 to 15.

REFERENCE SIGNS LIST

1: Power module
3: Semiconductor device (joint member)
10: Power module substrate
11: Ceramic substrate (insulating layer)
12: Circuit layer (aluminum member, metal member)
13: Metal layer (aluminum member, metal member)
20: Power module substrate with radiator plate (power module substrate with heat sink)
21: Radiator plate (joint member, heat sink)
40: First junction (solder joint structure)
41: First glass layer (glass layer)
42: First Ag layer (Ag layer)
43: First solder layer (solder layer)
44: Crystalline oxide particle
50: Second junction (solder joint structure)
51: Second glass layer (glass layer)
52: Second Ag layer (Ag layer)
53: Second solder layer (solder layer)
54: Crystalline oxide particle
101: Power module
110: Power module substrate
115: Buffer layer (joint member)
130: Power module substrate with cooler (power module substrate with heat sink)
131: Cooler (aluminum member, heat sink)
140: First junction (solder joint structure)
141: First glass layer (glass layer)
142: First Ag layer (Ag layer)
143: First solder layer (solder layer)
144: Crystalline oxide particle

The invention claimed is:

1. A solder joint structure on an aluminum member made of aluminum or aluminum alloy having a joint member including a solder material,
the solder joint structure comprising:
a glass layer formed on a surface of the aluminum member;
a silver (Ag) layer laminated on the glass layer; and
a solder layer laminated on the Ag layer,
wherein crystalline oxide particles are dispersed in the Ag layer.

2. The solder joint structure according to claim 1, wherein the crystalline oxide particles are composed of any one or two or more of titanium oxide, silicon oxide, and zinc oxide.

3. A power module comprising: a power module substrate in which a circuit layer made of the aluminum member is disposed on one surface of an insulating layer, and a semiconductor device joined to one surface of the circuit layer,
wherein a junction between the circuit layer and the semiconductor device is the solder joint structure described in claim 1.

4. A power module substrate with a heat sink, comprising:
a power module substrate in which a circuit layer is disposed on one surface of an insulating layer; and
a heat sink that is joined to the other surface side of the power module substrate;
wherein at least one of a joint surface of the heat sink and a joint surface of the power module substrate is composed of the aluminum member, and
a junction between the heat sink and the power module substrate is the solder joint structure described in claim 1.

* * * * *